US010497757B2

(12) United States Patent
Matsueda

(10) Patent No.: US 10,497,757 B2
(45) Date of Patent: Dec. 3, 2019

(54) DISPLAY DEVICE

(71) Applicant: TIANMA JAPAN, LTD., Kanagawa (JP)

(72) Inventor: Yojiro Matsueda, Kanagawa (JP)

(73) Assignee: TIANMA MICROELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/959,914

(22) Filed: Apr. 23, 2018

(65) Prior Publication Data

US 2018/0315801 A1  Nov. 1, 2018

(30) Foreign Application Priority Data

Apr. 28, 2017  (JP) ................... 2017-089847

(51) Int. Cl.
*H01L 27/32* (2006.01)
*G09G 3/3225* (2016.01)

(52) U.S. Cl.
CPC ....... *H01L 27/3218* (2013.01); *G09G 3/3225* (2013.01); *H01L 27/3216* (2013.01); *H01L 27/3279* (2013.01); *G09G 2300/0452* (2013.01); *G09G 2320/0209* (2013.01); *G09G 2320/0233* (2013.01); *G09G 2320/0242* (2013.01); *H01L 2227/323* (2013.01)

(58) Field of Classification Search
CPC ............. H01L 27/3218; H01L 27/3279; H01L 27/3276; H01L 51/3271; H01L 2227/323; H01L 51/5036; G09G 3/3225

USPC .............. 257/40, 72.79; 438/48, 82, 99, 128
See application file for complete search history.

(56) References Cited

U.S. PATENT DOCUMENTS

| 8,552,635 B2 | 10/2013 | Kim et al. | |
|---|---|---|---|
| 2012/0056531 A1* | 3/2012 | Park et al. | H01L 51/5036 303/506 |
| 2016/0148981 A1 | 5/2016 | Matsueda | |

FOREIGN PATENT DOCUMENTS

JP  2016-100296 A  5/2016

* cited by examiner

*Primary Examiner* — Thinh T Nguyen
(74) *Attorney, Agent, or Firm* — Young & Thompson

(57) ABSTRACT

A sub-pixel for a second color is disposed to be adjacent to a sub-pixel for a first color in a row direction. A sub-pixel for a third color is disposed to be adjacent to the sub-pixel for the first color in a column direction. Each of the sub-pixels for the first color, the sub-pixels for the second color, and the sub-pixels for the third color is connected with one of the scanning lines and one of the data lines. Number of main pixels per row is M and number of main pixels per column is N. Number of the scanning lines is (3/2)N. Number of sub-pixels connected with each of the scanning lines is 2M. Number of the data lines is 2M. Number of main pixels connected with each of the data lines is N. Number of sub-pixels connected with each of the data lines is (3/2)N.

8 Claims, 13 Drawing Sheets

DISPLAY DEVICE

BACKGROUND

This disclosure relates to a display device.

In place of liquid crystal display devices, organic light-emitting diode (OLED) display devices have come to be proposed. OLED elements are current-driven self-light-emitting elements and therefore, enable low power consumption, wide viewing angle, and high contrast ratio.

Active-matrix color OLED display devices include main pixels arrayed in a matrix, where each main pixel consists of a red (R) sub-pixel, a green (G) sub-pixel, and a blue (B) sub-pixel. Because of the characteristics of the OLED display device and the method of manufacturing the OLED display device, various sub-pixel layouts are proposed as disclosed in U.S. Pat. No. 8,552,635, for example.

Each sub-pixel includes a driving transistor for controlling the electric current to be supplied to the organic light-emitting film through the electrodes and a selecting transistor for selecting the sub-pixel. An OLED display device has scanning lines as many as main pixel rows and data lines three times as many as main pixel columns.

As represented by the full HD format, the trend toward higher definition in video or image format requires OLED display devices to have higher resolution. To achieve higher resolution, more scanning lines and data lines are required and further, more output terminals in the driver circuit. However, particularly in a small-sized display device, there is a limitation for the number of output terminals in the driver circuit.

To address the issue, rendering is employed to propose display devices having a smaller number of data lines. However, the rendering is a technology to virtually increase the resolution. The technique widely used for a liquid-crystal display device selects output sub-pixels for a data line with a demultiplexer in time division to achieve display at real resolution with a smaller number of data output terminals in the driver circuit.

SUMMARY

Compared to the liquid-crystal display device, a common OLED display device takes a long time to write data. Accordingly, the OLED display device may become short of the write time because of the delay time caused by the operation of the demultiplexer. Meanwhile, mounting the demultiplexer on the screen panel requires a wider frame area. Moreover, the increase in resolution reduces the distance between a data line and a pixel circuit, which increases effects of cross-talk.

An aspect of this disclosure is a display device including: main pixels arrayed in a matrix; scanning lines disposed to extend in a row direction and be distant from one another in a column direction perpendicular to the row direction; and data lines disposed to extend in the column direction and be distant from one another in the row direction. Each main pixel includes a sub-pixel for a first color, a sub-pixel for a second color, and a sub-pixel for a third color. In each main pixel, the sub-pixel for the second color is disposed to be adjacent to the sub-pixel for the first color in the row direction. In each main pixel, the sub-pixel for the third color is disposed to be adjacent to the sub-pixel for the first color in the column direction. Each of the sub-pixels for the first color, the sub-pixels for the second color, and the sub-pixels for the third color includes a transistor, a first electrode connected with the transistor, an element isolation film provided over the first electrode, a light emitting material area formed to cover an opening provided in the element isolation film, and a second electrode provided above the light emitting material area. Openings in the element isolation film define light emitting areas of the sub-pixels for the first color, the sub-pixels for the second color, and the sub-pixels for the third color. Each of the sub-pixels for the first color, the sub-pixels for the second color, and the sub-pixels for the third color is connected with one of the scanning lines and one of the data lines. The number of main pixels per row is M (M is a natural number) and number of main pixels per column is N (N is a positive even number). The number of the scanning lines is (3/2)N. The number of sub-pixels connected with each of the scanning lines is 2M. The number of the data lines is 2M. The number of main pixels connected with each of the data lines is N. The number of sub-pixels connected with each of the data lines is (3/2)N.

It is to be understood that both the foregoing general description and the following detailed description are exemplary and explanatory and are not restrictive of this disclosure.

EMBODIMENTS

Hereinafter, an embodiment of this invention will be described with reference to the accompanying drawings. It should be noted that the embodiment is merely an example to implement this invention and is not to limit the technical scope of this invention. Elements common to the drawings are denoted by the same reference signs.

Overall Configuration

Figure 1:
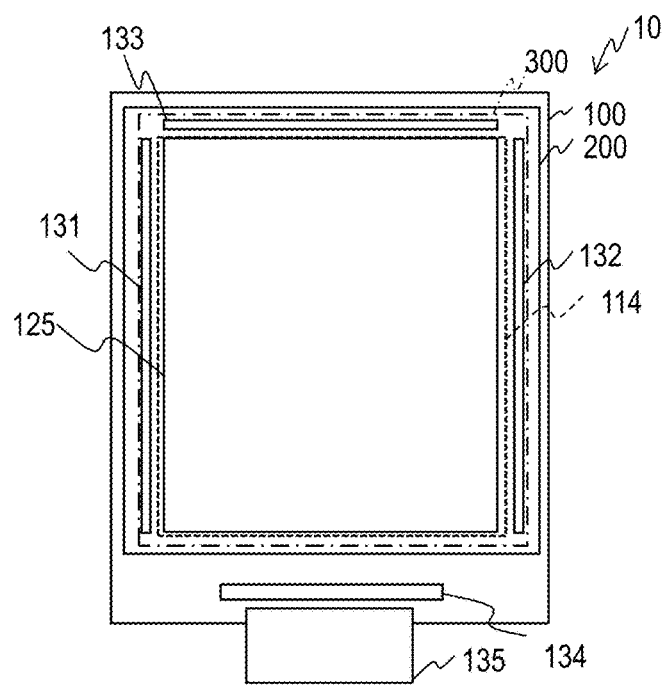
FIG. 1 schematically illustrates a configuration example of a display device.

FIG. 1 schematically illustrates a configuration example of an active matrix organic light-emitting diode (AMOLED) display device 10. Hereinafter, the AMOLED display device is merely referred to as display device. The display device 10 includes a thin film transistor (TFT) substrate 100 on which light emitting elements (also referred to as OLED elements) are formed, an encapsulation substrate 200 for encapsulating the light emitting elements, and a bond (glass frit sealer) 300 for bonding the TFT substrate 100 with the encapsulation substrate 200. The space between the TFT substrate 100 and the encapsulation substrate 200 is filled with dry air and sealed up with the bond 300.

In the periphery of a cathode electrode forming region 114 outer than the display region 125 of the TFT substrate 100, a scanning driver circuit 131, an emission control driver circuit 132, a protection circuit 133, and a driver IC 134 are provided. These are connected to the external devices via a flexible printed circuit (FPC) 135.

The scanning driver circuit 131 drives scanning lines of the TFT substrate 100. The emission control driver circuit 132 drives emission control lines to control the emission periods of sub-pixels. The driver IC 134 can be mounted with an anisotropic conductive film (ACF). The FPC 135 prevents damage by electrostatic discharge. The driver IC 134 provides power and timing signals (control signals) to the scanning driver circuit 131 and the emission control driver circuit 132 and further, provides data voltage corresponding to image data to data lines. In other words, the driver IC 134 is a data driver circuit and has a display control function.

Wiring of Substrate

Figure 2:
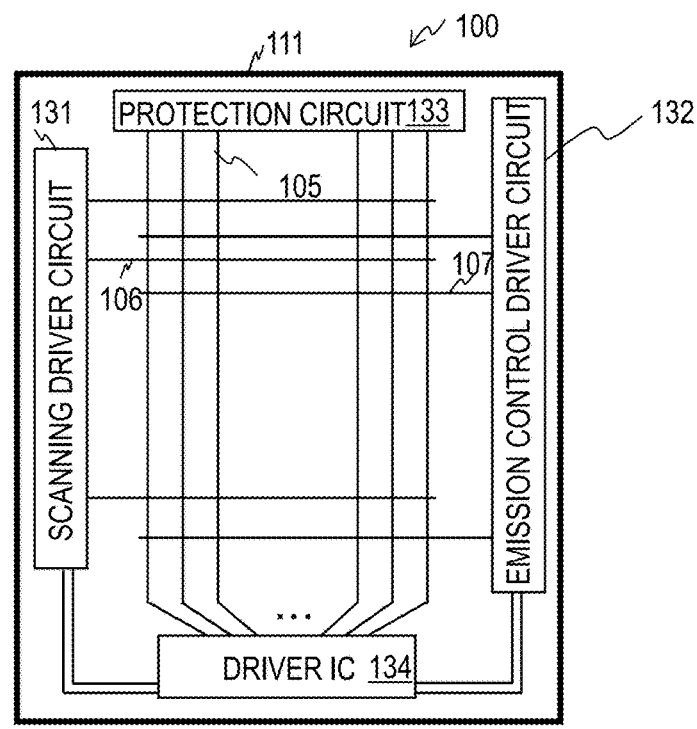
FIG. 2 schematically illustrates circuitry of a TFT substrate.

FIG. 2 schematically illustrates circuitry of the TFT substrate 100. On an insulating substrate 111, circuits for display and a touch panel are provided. Within the display region 125 of the insulating substrate 111, not-shown main pixels are arrayed in a matrix. Furthermore, data lines 105, scanning lines 106, and emission control lines 107 are provided in the display region 125. FIG. 2 shows only a part of the data lines 105, scanning lines 106, and emission control lines 107 and omits power lines provided in parallel to the data lines 105 and connected with the driver IC 134.

In the example of FIG. 2, the scanning lines 106 and the emission control lines 107 are disposed to extend in the horizontal direction and be distant from one another in the vertical direction. The scanning lines 106 and the emission control lines 107 are provided alternately. The data lines 105 are disposed to extend in the vertical direction and be distant from one another in the horizontal direction. The data lines 105 are connected with the driver IC 134 and the protection circuit 133; the scanning lines 106 are connected with the scanning driver circuit 131; and the emission control lines 107 are connected with the emission control driver circuit 132.

Hereinafter, the direction in which the data lines are spread (the horizontal direction in FIG. 2) is referred to as row direction. The direction in which the scanning lines are spread (the vertical direction in FIG. 2) is referred to as column direction. The row direction and the column direction do not depend on the orientation of the display device 10 for the user and are defined by the layout of the data lines and scanning lines.

Pixel Circuit

Figure 3A:
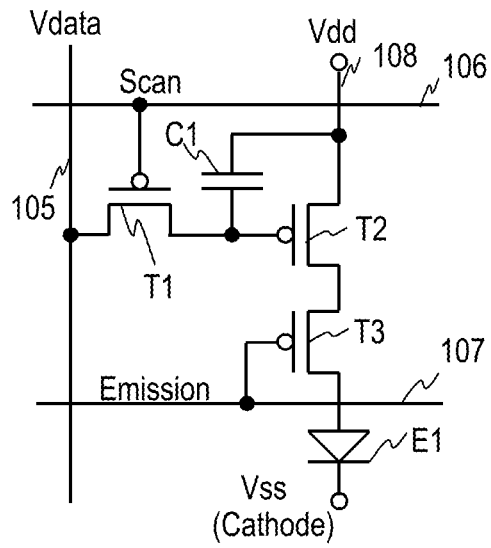
FIG. 3A illustrates a configuration example of a pixel circuit.

A plurality of circuits (pixel circuits) are formed on the insulating substrate 111 to control the current to be supplied to the anode electrodes of sub-pixels. FIG. 3A illustrates a configuration example of a pixel circuit. Each sub-pixel includes an OLED element E1 and a pixel circuit including a first transistor T1, a second transistor T2, a third transistor T3, and a storage capacitor C1. The transistors are thin film transistors (TFTs). Hereinafter, the first transistor T1 to the third transistor T3 are abbreviated as transistor T1 to transistor T3.

The transistor T1 is a switch for selecting the sub-pixel. The transistor T1 is a p-channel field effect transistor (FET) and its gate terminal is connected with a scanning line 106. The drain terminal is connected with a data line 105. The source terminal is connected with the gate terminal of the transistor T2.

The transistor T2 is a transistor for driving the OLED element E1. The transistor T2 is a p-channel FET and its gate terminal is connected with the source terminal of the transistor T1. The source terminal of the transistor T2 is connected with a power line 108 (Vdd). The drain terminal is connected with the source terminal of the transistor T3. The storage capacitor C1 is provided between the gate terminal and the source terminal of the transistor T2.

The transistor T3 is a switch for controlling supply/stop of the driving current to the OLED element E1. The transistor T3 is a p-channel FET and its gate terminal is connected with an emission control line 107. The source terminal of the transistor T3 is connected with the drain terminal of the transistor T2. The drain terminal is connected with the OLED element E1.

The scanning driver circuit 131 outputs a selecting pulse to the scanning line 106 to open the transistor T1. The data voltage supplied from the driver IC 134 through the data line 105 is stored to the storage capacitor C1. The storage capacitor C1 holds the stored voltage during the period of one frame. The conductance of the transistor T2 changes in an analog manner in accordance with the stored voltage, so that the transistor T2 supplies a forward bias current corresponding to a light emission level to the OLED element E1.

The transistor T3 is located on the driving current supply path. The emission control driver circuit 132 outputs a control signal to the emission control line 107 to open or close the transistor T3. When the transistor T3 is open, the driving current is supplied to the OLED element El. When the transistor T3 is closed, this supply is stopped. The lighting period (duty ratio) in the period of one field can be controlled by opening and closing the transistor T3.

Figure 3B:
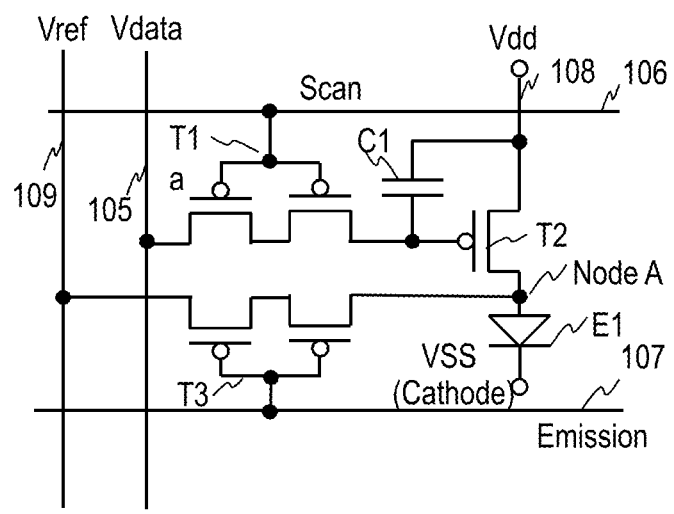
FIG. 3B illustrates another configuration example of a pixel circuit.

FIG. 3B illustrates another configuration example of a pixel circuit. The differences from the pixel circuit in FIG. 3A are the transistor T1a and the transistor T3. The transistor T1a is a switch having the same function as the transistor T1 in FIG. 3A, or a switch for selecting the sub-pixel. The transistor T1a has a dual-gate structure to reduce the off-state current.

For example, the transistor T3 can be used to reset the anode electrode of the OLED element E1 once to a sufficiently low voltage that is lower than the black signal level to prevent crosstalk caused by leak current between the OLED element E1 and the other OLED element E1 in the neighboring pixel. Once the black signal is applied to the anode electrode (Node A) of the OLED element E1, the charge stored in the self-capacitance of the OLED suppresses the unexpected emission by the leak current flowed from the neighboring pixel.

The transistor T3 can also be used to measure a characteristic of the transistor T2. For example, the current-voltage characteristic of the transistor T2 can be accurately measured by measuring the current flowing from the power line 108 (Vdd) to the reference voltage supply line 109 (Vref) under the bias conditions selected so that the transistor T2 will operate in the saturated region and the switching transistor T3 will operate in the linear region. If the differences in current-voltage characteristic among the transistors T2 of individual sub-pixels are compensated for by generating data signals at an external circuit, a highly-uniform display image can be attained.

In the meanwhile, the current-voltage characteristic of the OLED element E1 can be accurately measured by applying a voltage to light the OLED element E1 from the reference voltage supply line 109 when the transistor T2 is off and the transistor T3 is operating in the linear region. In the case where the OLED element E1 is deteriorated because of long-term use, for example, if the deterioration is compensated for by generating a data signal at an external circuit, the display device can have a long life spun.

Figure 3C:
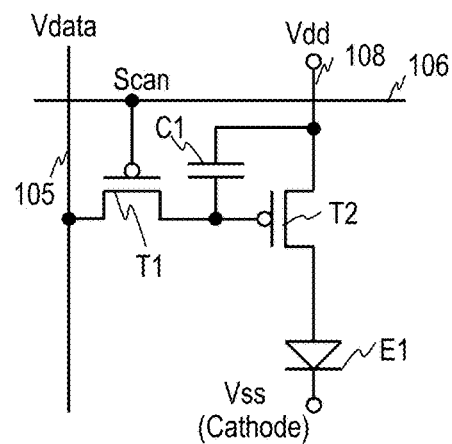
FIG. 3C illustrates still another configuration example of a pixel circuit.

Hereinafter, examples of the layout of sub-pixels and lines and the method of controlling the sub-pixels (method of selectively driving the sub-pixels) are described. The layout of main pixels is described as necessary. For simplicity of explanation, an example using sub-pixels having the pixel circuit configuration illustrated in FIG. 3C is described. The pixel circuit in FIG. 3C has a configuration in which the transistor T3 and the emission control line are omitted from the pixel circuit in FIG. 3A. The layout and the pixel control method are applicable to other pixel circuit configurations like those illustrated in FIGS. 3A and 3B.

Figure 4:
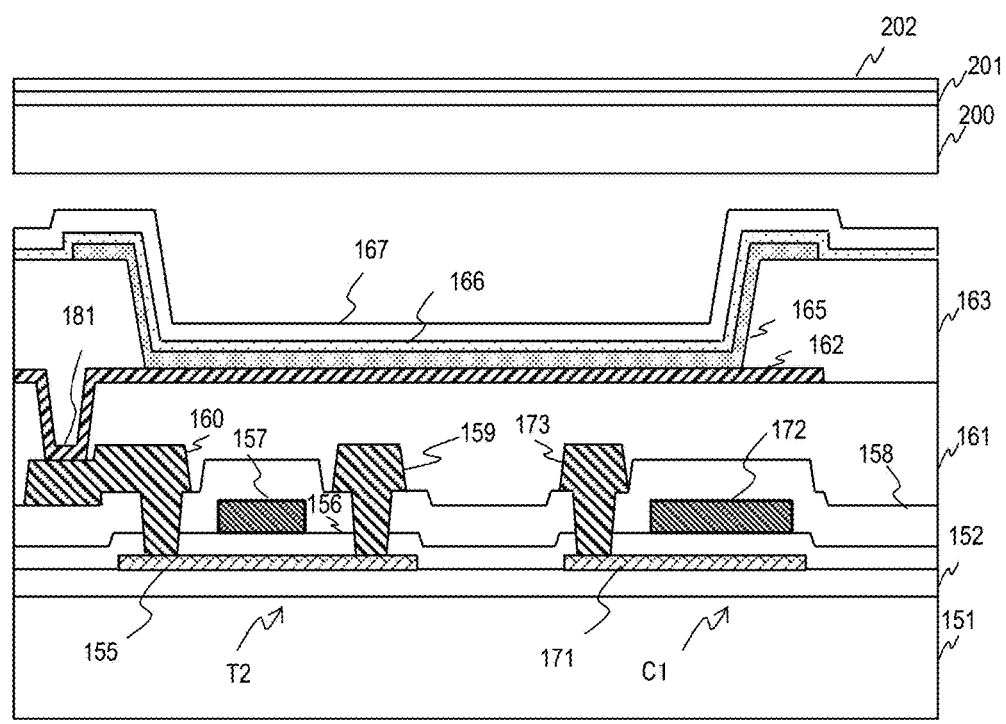
FIG. 4 schematically illustrates a part of a cross-sectional structure of a sub-pixel.

FIG. 4 schematically illustrates a part of a cross-sectional structure of a sub-pixel. The definitions of top and bottom in the following description correspond to the top and the bottom of the drawing. A sub-pixel displays one of the colors of red, green, and blue. A red sub-pixel, a green sub-pixel, and a blue sub-pixel constitute one pixel (main pixel). A sub-pixel is composed of an OLED element and a pixel circuit including a plurality of transistors (see FIG. 3C). FIG. 4 schematically illustrates the structures of the driving transistor T2, the storage capacitor C1, and the OLED element E1 in the pixel circuit illustrated in FIG. 3C.

The pixel circuit is formed between an insulating substrate 151 and an encapsulation substrate 200. The pixel circuit includes a lower electrode (for example, an anode electrode 162), an upper electrode (for example, a cathode electrode 166), and an organic light-emitting film 165. FIG. 4 illustrates an example of a sub-pixel of top-emission type, in which a cathode electrode 166 is a transparent electrode that transmits the light from the organic light-emitting film 165 toward the encapsulation substrate 200. The sub-pixel can be of bottom-emission type.

The cathode electrode 166 has a shape that fully covers the entire display region 125. The anode electrode 162 is formed separately for the corresponding sub-pixel. A part of the light from the organic light-emitting film 165 is reflected by the anode electrode 162, passes through the cathode electrode 166 and the encapsulation substrate 200, and goes out to the screen surface of the display device 10. The sub-pixel may have a structure in which the anode electrode is an upper electrode and the cathode electrode is a lower electrode.

On the insulating substrate 151, a channel (semiconductor layer) 155 of the transistor T2 and an electrode (doped semi-conductor layer) 171 of the storage capacitor C1 are formed with an insulating film 152 interposed. The insulating substrate 151 corresponds to the insulating substrate 111 in FIG. 2.

The channel 155 and the electrode 171 are the same layer, which can be made of low-temperature poly silicon (LTPS). For example, the channel 155 can be a differently-doped semiconductor and the electrode 171 can be highly-doped LTPS.

Above the channel 155, a gate electrode 157 is provided with a gate insulating film 156 interposed. Above the electrode 171, an electrode 172 is provided with the gate insulating film 156 interposed. The gate electrode 157 and the electrode 172 are the same layer; in each sub-pixel, the gate electrode 157 and the electrode 172 are continuous.

An interlayer insulating film 158 is provided over the layer of the gate electrode 157. A source electrode 159 and a drain electrode 160 are provided above the interlayer insulating film 158. The source electrode 159 and the drain electrode 160 are connected with the channel 155 through contact holes in the interlayer insulating film 158.

The storage capacitor C1 includes a contact 173 for connecting the electrode 171 and a power line 108. The contact 173 is connected with the electrode 171 through a contact hole in the interlayer insulating film 158. The source electrode 159, the drain electrode 160, and the contact 173 are formed as a layer of a metal having a high-melting point or an alloy thereof, for example.

Over the source electrode 159, the drain electrode 160, and the contact 173, an insulative planarization film 161 is provided. Above the insulative planarization film 161, an anode electrode 162 is provided. The anode electrode 162 is connected with the drain electrode 160 through a contact 181 provided in a contact hole in the planarization film 161.

Above the anode electrode 162, an insulative pixel defining layer (PDL) 163 is provided to separate OLED elements. The pixel defining layer 163 is also referred to as element isolation film. An OLED element is composed of an anode electrode 162, an organic light-emitting film 165, and the cathode electrode 166 (a part thereof) stacked in this order. The OLED element is formed in an opening of the pixel defining layer 163. As noted from this description, the openings of the pixel defining layer 163 define the light emitting areas of individual sub-pixels.

Above the anode electrode 162, the organic light-emitting film 165 is provided. The organic light-emitting film 165 is in contact with the pixel defining layer 163 in the opening and its periphery. The cathode electrode 166 is provided over the organic light-emitting film 165. The cathode electrode 166 is a transparent electrode. The cathode electrode 166 transmits all or part of the visible light emitted from the organic light-emitting film 165. A cap layer 167 is provided over the cathode electrode 166.

The encapsulation substrate 200 is fixed at a predetermined distance from the TFT substrate 100. The encapsulation substrate 200 is a transparent insulating substrate, which can be made of glass. There is provided a space between the TFT substrate 100 and the encapsulation substrate 200 and a gas such as dry air is tightly packed therein. Such an air-tight structure prevents moisture from entering the organic light-emitting element to deteriorate the organic light-emitting element. An encapsulation structural unit different from the encapsulation substrate 200 can be used, such as a thin film encapsulation (TFE) structural unit having a stacked structure of an inorganic film and an organic film or a structure that covers the whole area with a flexible or inflexible encapsulation substrate made of a material having high resistance to water permeation. Furthermore, a $\lambda/4$ plate 201 and a polarizing plate 202 are provided over the light emission surface (top face) of the encapsulation substrate 200 to prevent reflection of light entering from the external.

Pixel Layout

Figure 5A:
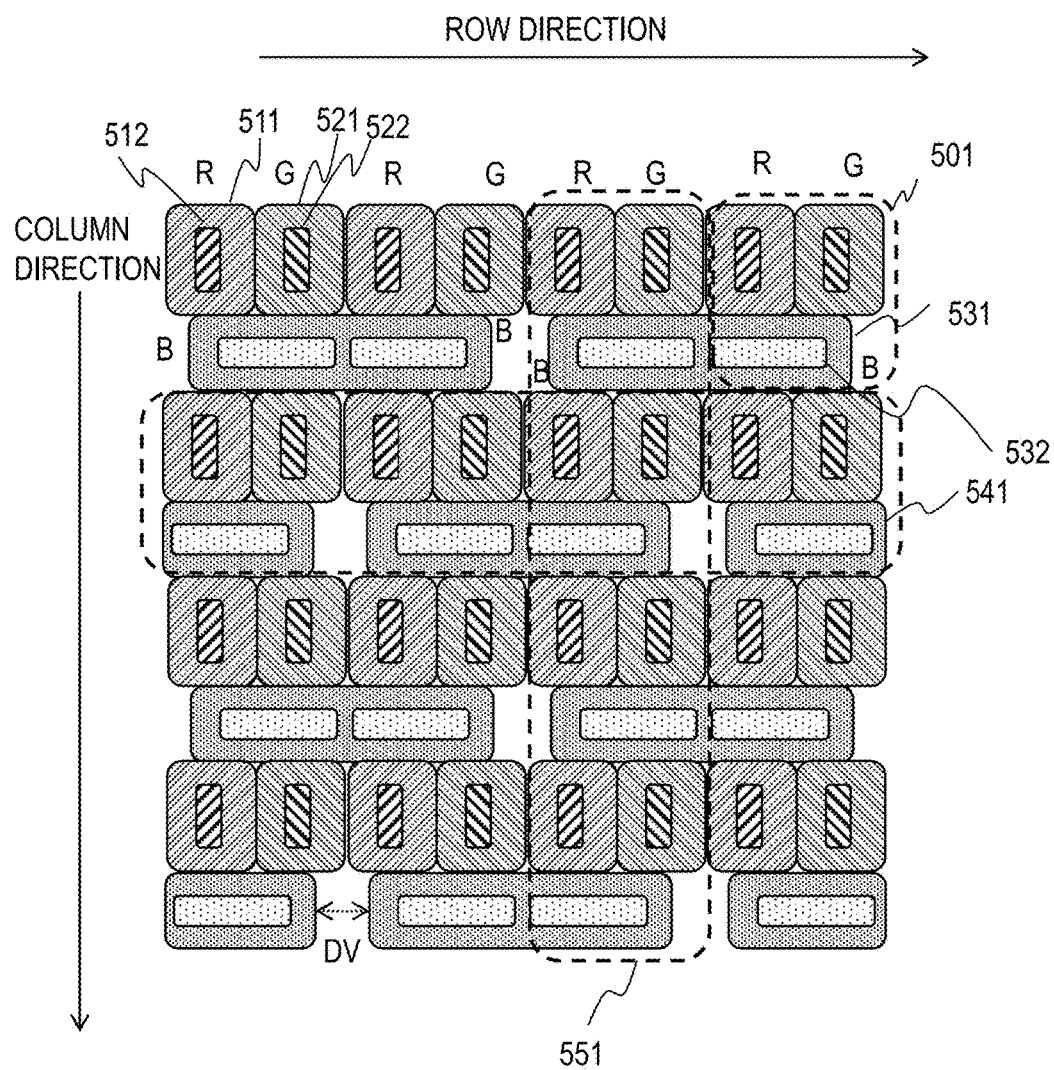
FIG. 5A illustrates a layout of organic light-emitting material areas and light emitting areas of sub-pixels.
Figure 5B:
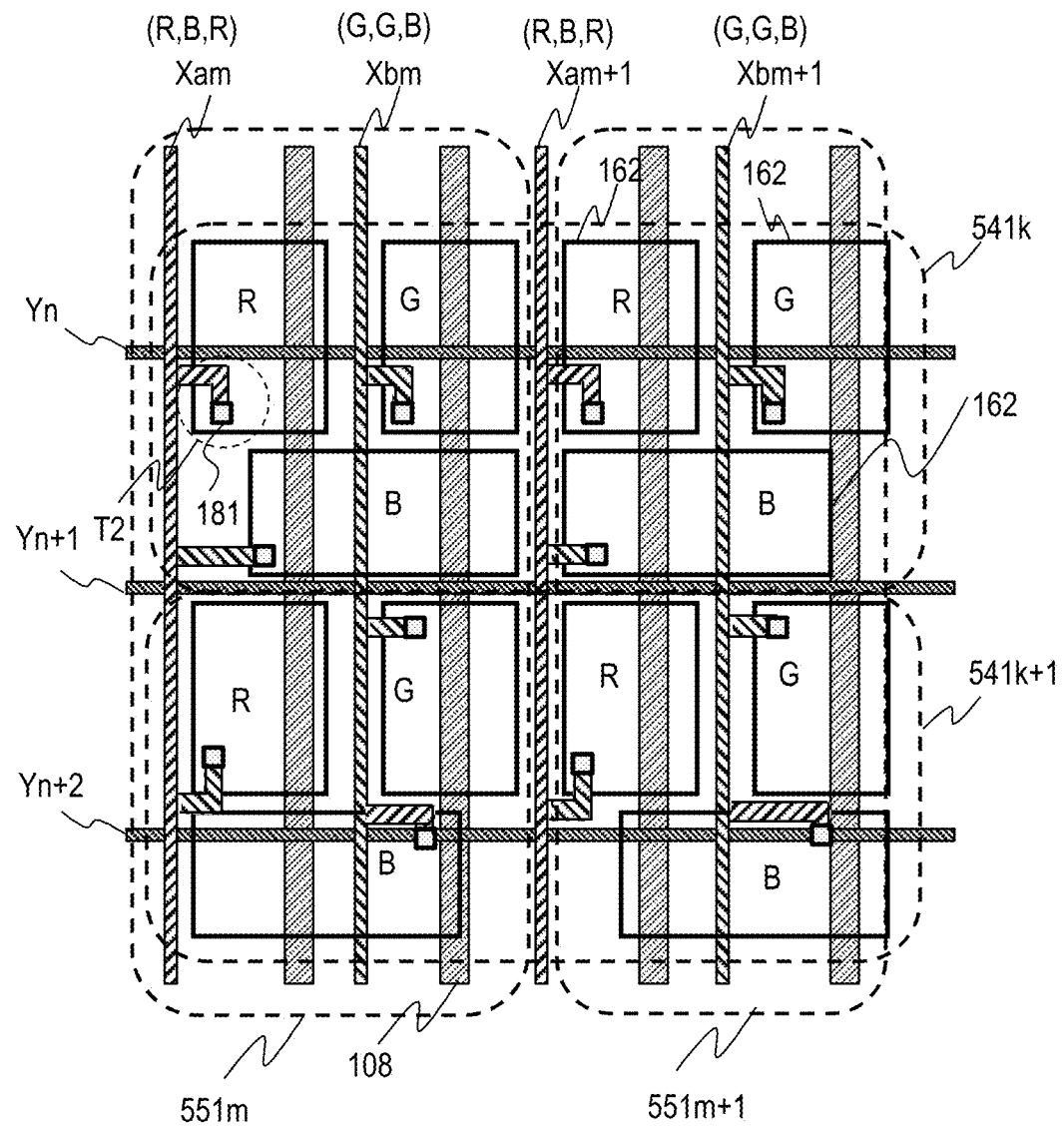
FIG. 5B illustrates a layout of light emitting areas of sub-pixels and lines and an example of connection of the lines with the light emitting areas.
Figure 5C:
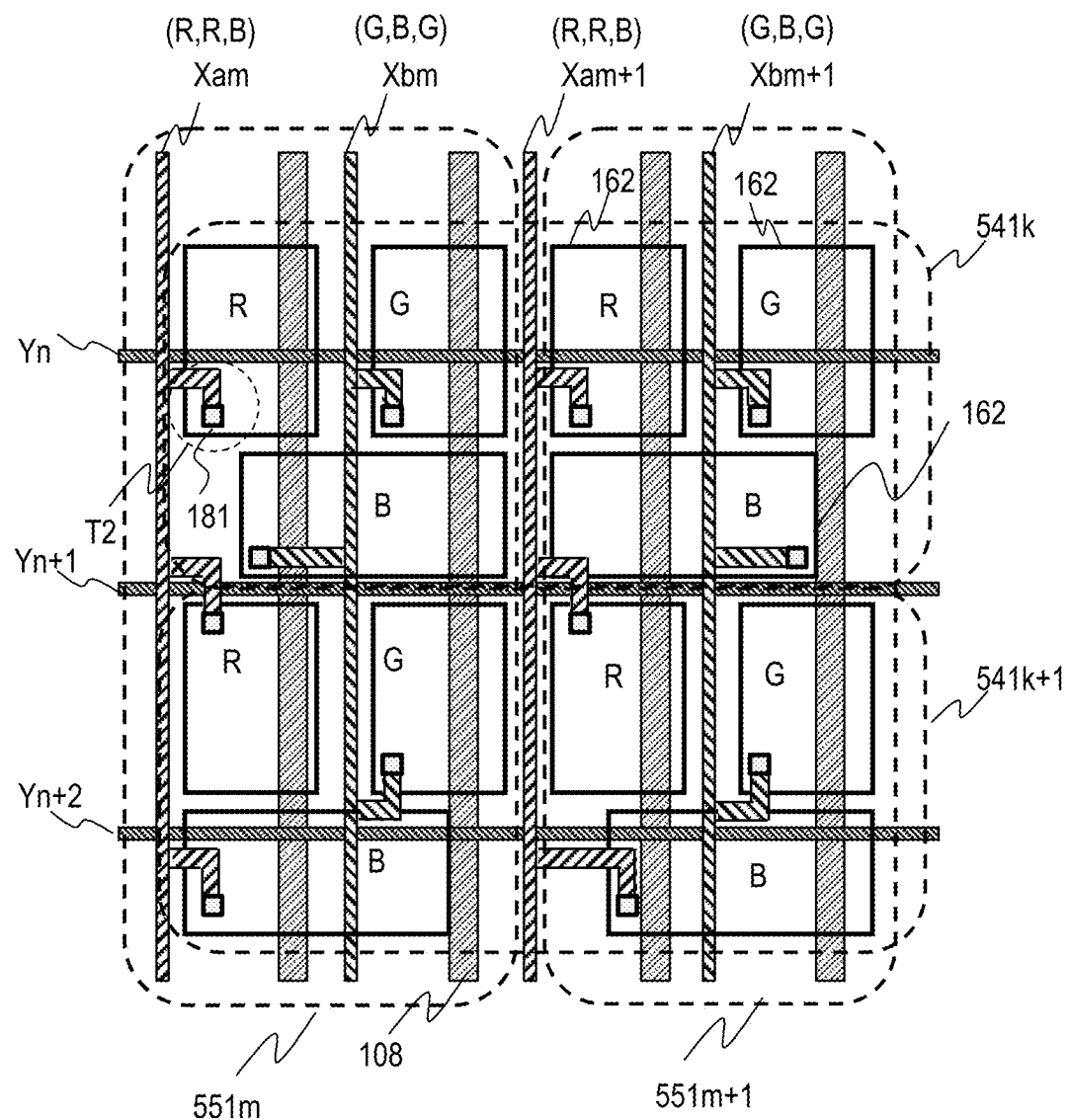
FIG. 5C illustrates another example different from FIG. 5B.

FIGS. 5A, 5B, and 5C illustrate an example of the pixel layout of this disclosure. FIG. 5A illustrates a layout of organic light-emitting material areas and light emitting areas of sub-pixels in this pixel layout. FIG. 5B illustrates a layout of light emitting areas of sub-pixels and lines and an example of connection of the lines with the light emitting areas in this pixel layout. FIG. 5C illustrates another example different from FIG. 5B.

FIG. 5A provides pixels of four rows by four columns, in which one main pixel row 541, one main pixel column 551, and one main pixel 501 are denoted by reference numerals as examples. Each main pixel 501 consists of a R sub-pixel, a G sub-pixel, and a B sub-pixel. The pixels in this disclosure have a basic structure composed of three sub-pixels for three different colors adjacent to one another; a plurality of main pixels 501 are arrayed in a matrix of M rows by N columns. It should be noted that the concept of this disclosure is applicable to pixels for a color group different from the one consisting of R, G and B.

Each R sub-pixel includes an organic R-light-emitting material area 511 and an R-light emitting area 512. Each G sub-pixel includes an organic G-light-emitting material area 521 and a G-light emitting area 522. Each B sub-pixel includes an organic B-light-emitting material area 531 and a B-light emitting area 532. The organic light-emitting material areas correspond to the organic light-emitting film 165 in FIG. 4. In the example of FIG. 5A, the light emitting material areas and the light emitting areas have substantially rectangular shapes but may have different shapes.

Each light emitting area is an area of an organic light-emitting film 165 that is sandwiched by an anode electrode 162 and a cathode electrode 166 (see FIG. 4). The light emitting area corresponds to an opening in the pixel defining layer 163. The light emitting area is included in an organic light-emitting material area having a larger size than the light emitting area. To deposit organic light-emitting materials for individual colors, it is common to use a fine metal mask (FMM). Depositing an organic light-emitting material for a color places an FMM having openings slightly larger than the light emitting areas on the TFT substrate in correct alignment to selectively deposit the organic light-emitting material for the color.

The pattern of the openings in the FMM is designed in such a manner that the rim of each opening will be located on the boundary substantially in the middle between the light emitting area of the color and the light emitting areas of the other colors in the area outer than the light emitting area of the color. Since the electric current flows only within the opening of the pixel defining layer 163, this area is a light emitting area.

In each main pixel 501, the R sub-pixel and the G sub-pixel are disposed to be adjacent to each other in the row direction. The B sub-pixel is disposed to be adjacent to the R sub-pixel and the G sub-pixel in the column direction. In the example of FIG. 5A, the G sub-pixel is disposed on the right of the R sub-pixel but they can be replaced with each other. In the example of FIG. 5A, the B sub-pixel is disposed lower than the R sub-pixel and the G sub-pixel but the B sub-pixel can be disposed upper than the R sub-pixel and the G sub-pixel.

The life (also referred to as light emitting life) of the organic light-emitting material depends on the density of the current that flows in the material; the life becomes exponentially shorter as the density of the current increases. Accordingly, to secure a sufficient life while maintaining the required brightness, it is effective to reduce the current density by enlarging the light emitting area for the color having the shortest life relatively to the light emitting area for the other colors. In general, the life of the organic light-emitting material for B is shorter than the organic light-emitting material for R or G. Accordingly, the B-light emitting areas 532 in this example are larger than the R-light emitting areas 512 and the G-light emitting areas 522 to extend the life of the display device 10. If the organic light-emitting material for a color different from B has the shortest life, the sub-pixels for the different color replace the B sub-pixels.

Between adjacent main pixels, the organic light-emitting material areas 511 of the R sub-pixels are separate and the organic light-emitting material areas 521 of the G sub-pixels are also separate. Between main pixels adjacent in the column direction, the organic light-emitting material areas 531 of the B sub-pixels are separate.

When the B organic light emitting material is deposited, horizontally adjacent B sub-pixel pair uses same metal shadow mask aperture. Though the two B sub-pixels have shared the same organic light-emitting material area 531, B emission areas 532 is separated because the PDL (Pixel Definition Layer) defines the area for the emission current to be provided. In each main pixel row, the organic light-emitting material areas 531 of the two adjacent B sub-pixel pairs are separate and distant (see the dotted arrows DV). The continuous organic light-emitting material area for two B sub-pixels allows the light emitting areas 532 of the B sub-pixels to be larger.

The separate organic light-emitting material areas for two B sub-pixel pairs allows the FMM for B sub-pixels to have slot-like openings instead of slit-like openings. Such a structure increases the strength of the FMM, makes the manufacturing and handling of the FMM easier, and increases the precision in deposition to the organic light-emitting material areas 531 of B sub-pixels.

Although the organic light-emitting material areas 531 of a B sub-pixel pair are continuous, the anode electrodes 162 of the B sub-pixels are separate and driven independently. Accordingly, lighting of the B sub-pixels of a B sub-pixel pair is controlled independently.

As illustrated in FIG. 5A, the B sub-pixel pairs are staggered. Between adjacent main pixel rows, the centers of the B sub-pixel pairs are located differently in the row direction. In the first main pixel row, each B sub-pixel pair is formed between a main pixel in an odd-numbered column and the main pixel in the next even-numbered column. In the second main pixel row adjacent to the first main pixel row, each B sub-pixel pair is formed between a main pixel in an even-numbered column and the main pixel in the next odd-numbered column. The arrangements of B sub-pixel pairs are identical among the even-numbered main pixel rows (the second and the fourth rows) and identical among the odd-numbered main pixel rows (the first and the third rows). This configuration averages the stresses on the bridges of the FMM to prevent deformation of the FMM.

In the example of FIG. 5A, the R-light emitting area 512 in an R sub-pixel is located substantially at the center of the organic R-light-emitting material area 511 and its size in the column direction is longer than its size in the row direction. The G-light emitting area 522 in a G sub-pixel is located substantially at the center of the organic G-light-emitting material area 521 and its size in the column direction is longer than its size in the row direction.

In a B sub-pixel pair, the two B-light emitting areas 532 are symmetrical about the central line therebetween. The size of each B-light emitting area 532 in the row direction is longer than the size in the column direction. The distance from the end of the light emitting area to the end of the organic light-emitting material area is determined depending on the margin required by the manufacturing process.

To achieve a larger B-light emitting area 532, the center of the B-light emitting area 532 of a pixel is located closer to the paired other main pixel than the center in the row direction of the pixel or the center between the R and G sub-pixels in the pixel. The distance between the B-light emitting areas 532 in a B sub-pixel pair (between the ends and between the centers thereof) is shorter than the distance between the B-light emitting areas 532 of adjacent B sub-pixels belonging to different B sub-pixel pairs.

Accordingly, the distances in the row direction between the center of a B sub-pixel and the center of a G sub-pixel are different between B sub-pixels of a B sub-pixel pair. Among the colors of R, G, and B, B has the lowest luminosity factor and G has the highest. As illustrated in FIG. 5A, staggering B sub-pixel pairs eliminates pixels including a B sub-pixel close to a G sub-pixel from being disposed one after another, so that pixels including a B sub-pixel close to a G sub-pixel are disposed alternately with pixels including a B sub-pixel far from a G sub-pixel. This layout allows B sub-pixels having larger light emitting areas and moreover, balances the non-uniform visibility within the display region 125 to prevent generation of color fringe. The color fringe can be further prevented by adjusting the sizes and the locations of the B-light emitting areas.

The B-light emitting areas 532 can be formed and disposed in a manner different from FIG. 5A. For example, the B-light emitting areas 532 can be disposed uniformly in a main pixel row. Such a configuration achieves better image quality than the configuration example in FIG. 5A. In each B sub-pixel pair, the center in the row direction between two B-light emitting areas 532 can be located at a position different from the center in the row direction of the pixel pair.

FIG. 5B illustrates a layout of light emitting areas of sub-pixels and lines and connection of the lines with the light emitting areas in the same pixel layout as the one shown in FIG. 5A. In this example, when the number of main pixel rows is N (N is a positive even number) and the number of main pixel columns is M (M is a natural number), the number of scanning lines connected with the main pixels is (3/2)N and the number of data lines connected with the main pixels is 2M (=3*M*2/3). The number of sub-pixels connected with each scanning line is 2M and the number of main pixels connected with one scanning line is M or 2M. Each scanning line is connected with only a part of the sub-pixels in one pixel row. The number of main pixels connected with each data line is N and the number of sub-pixels connected with each data line is (3/2)N.

FIG. 5B includes four pixels, four data lines Xam, Xbm, Xam+1, and Xbm+1, three scanning lines Yn, Yn+1, and Yn+2, and four power lines 108. The remaining area in the display region 125 has the same configuration as FIG. 5B.

The n-th (n is a natural number) scanning line Yn is connected with all R sub-pixels and all G sub-pixels in the k-th (k is a natural number) main pixel row 541$k$; these all R sub-pixels and all G sub-pixels are selected (scanned) by a scanning signal supplied from the scanning line Yn. The (n+1)th scanning line Yn+1 is connected with all B sub-pixels in the k-th main pixel row 541$k$ and all G sub-pixels in the (k+1)th main pixel row 541$k$+1; these all B sub-pixels and all G sub-pixels are selected by a scanning signal supplied from this scanning line Yn+1.

The (n+2)th scanning line Yn+2 is connected with all R sub-pixels and all B sub-pixels in the (k+1)th main pixel row 541$k$+1; these all R sub-pixels and all B sub-pixels are selected by a scanning signal supplied from this scanning line Yn+2. As noted from this description, a plurality of scanning lines in this embodiment include two types of scanning lines: the first type of scanning lines (for example, the scanning line Yn) are connected with sub-pixels for two different colors (for example, R and G) in one main pixel row (for example, the main pixel row 541$k$) and the second type of scanning lines (for example, the scanning line Yn+1) are connected with sub-pixels for two different colors (for example, B and G) in two main pixel rows (for example, the main pixel rows 541$k$ and 541$k$+1).

Each of the three scanning lines Yn, Yn+1, and Yn+2 selects 2/3 (2M) of the sub-pixels (3M) included in one main pixel row. In other words, all the sub-pixels in two main pixel rows are selected by three scanning lines. The scanning lines Yn and Yn+2 select 2M sub-pixels in one main pixel row and the scanning line Yn+1 selects M sub-pixels per main pixel row in two main pixel rows. In the remaining area of the display region 125, the same connection as the connection of the scanning lines Yn, Yn+1, and Yn+2 with sub-pixels is repeated.

The data line Xam is connected with all R sub-pixels and a half of the B sub-pixels in the m-th (m is a natural number) main pixel column 551$m$. The data line Xbm is connected with all G sub-pixels and the remaining half of the B sub-pixels in the m-th main pixel column 551$m$. The B sub-pixels in the main pixel column 551$m$ are connected with the data lines Xam and Xbm alternately. In the example of FIG. 5B, the data line Xam is connected with the B sub-pixels in the odd-numbered main pixel rows and the data line Xbm is connected with the B sub-pixels in the even-numbered main pixel rows.

The data line Xam+1 is connected with all R sub-pixels and a half of the B sub-pixels in the (m+1)th (m is a natural number) main pixel column 551$m$+1. The data line Xbm+1 is connected with all G sub-pixels and the remaining half of the B sub-pixels in the (m+1)th main pixel column 551$m$+1. The B sub-pixels in the main pixel column 551$m$+1 are connected with the data lines Xam+1 and Xbm+1 alternately. In the example of FIG. 5B, the data line Xam+1 is connected with the B sub-pixels in the odd-numbered main pixel rows and the data line Xbm+1 is connected with the B sub-pixels in the even-numbered main pixel rows.

The data lines Xam and Xam+1 repeat a loop of outputting to an R sub-pixel, outputting to a B sub-pixel, and outputting to an R sub-pixel. The data lines Xbm and Xbm+1 repeat a loop of outputting to a G sub-pixel, outputting to a G sub-pixel, and outputting to a B sub-pixel.

The data lines Xam, Xbm, Xam+1, and Xbm+1 are disposed to overlap with neither any R sub-pixel nor any G sub-pixel. Each data line extends between an R sub-pixel and a G sub-pixel in the area sandwiched by the outermost main pixel columns on both sides. The data lines Xam, Xbm, Xam+1, and Xbm+1 are disposed alternately with power lines 108. In the example of FIG. 5B, each power line 108 supplies power to the sub-pixels through the driving transistor T2 connected with an adjacent data line (for example, the data line on the left).

In the remaining area of the display region 125, the same connection as the connection of the data lines Xam and Xbm with sub-pixels is repeated.

FIG. 5C illustrates another example of connection of the data lines with the sub-pixels. Differences from FIG. 5B are mainly described with reference to FIG. 5C. The data line Xam is connected with all R sub-pixels and B sub-pixels in the even-numbered main pixel rows in the main pixel column 551m. The data line Xbm is connected with all G sub-pixels and B sub-pixels in the odd-numbered main pixel rows in the main pixel column 551m.

The data line Xam+1 is connected with all R sub-pixels and B sub-pixels in the even-numbered main pixel rows in the main pixel column 551m+1. The data line Xbm+1 is connected with all G sub-pixels and B sub-pixels in the odd-numbered main pixel rows in the main pixel column 551m+1.

The data lines Xam and Xam+1 repeat a loop of outputting to an R sub-pixel, outputting to an R sub-pixel, and outputting to a B sub-pixel. The data lines Xbm and Xbm+1 repeat a loop of outputting to a G sub-pixel, outputting to a B sub-pixel, and outputting to a G sub-pixel.

In the examples of FIGS. 5B and 5C, each data line is connected with sub-pixels for two colors. The R sub-pixels are connected with only the odd-numbered data lines; the G sub-pixels are connected with only the even-numbered data lines; and the B sub-pixels are connected with all data lines. The connection of the data lines with the sub-pixels for individual colors can be different from these examples.

Figure 6:
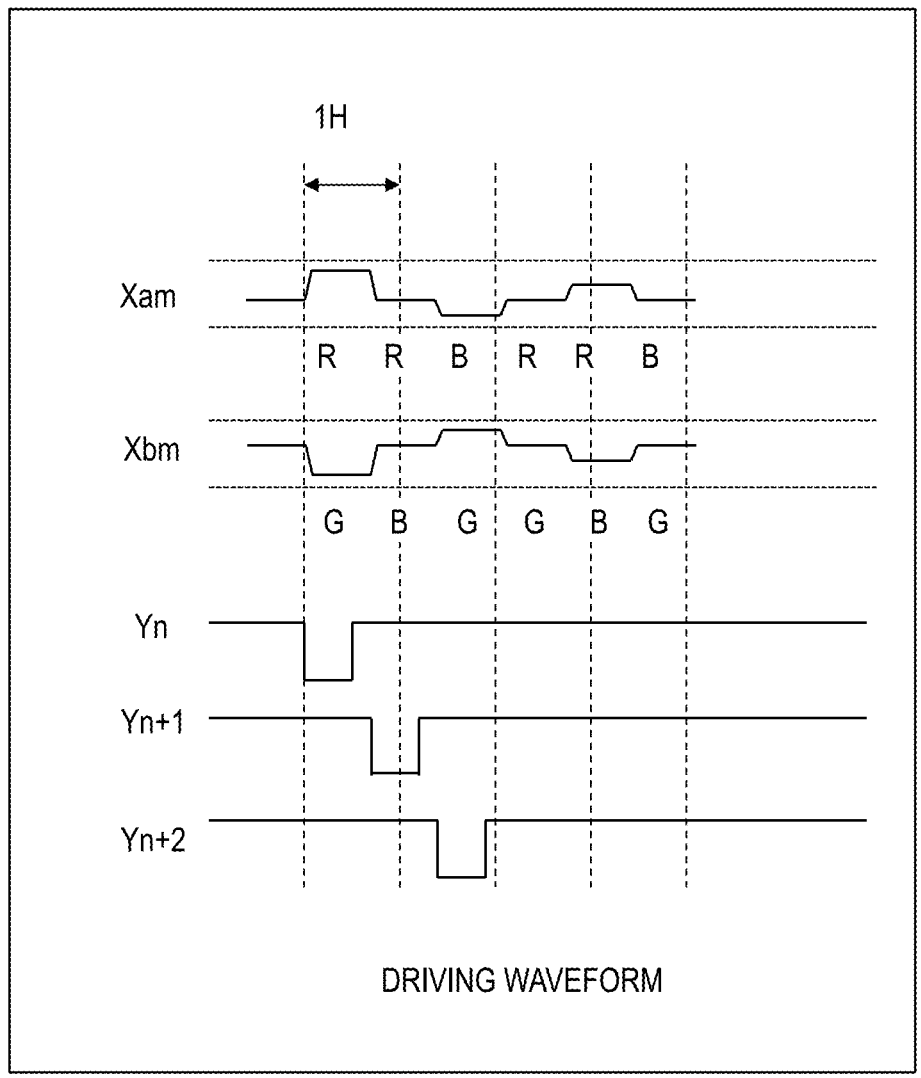
FIG. 6 is a timing chart of driving sub-pixels in the pixel layout of FIG. 5C.

FIG. 6 is a timing chart of driving sub-pixels in the pixel layout of FIG. 5C. FIG. 6 provides waveforms of data signals (hereinafter, referred to as signals) from the data lines Xam and Xbm and waveforms of selecting pulses from the scanning lines Yn, Yn+1, and Yn+2. The scanning lines Yn, Yn+1, and Yn+2 successively output selecting pulses at different times. The selecting pulses are output by the scanning driver circuit 131 to the scanning lines Yn, Yn+1, and Yn+2. The data signals are output by the driver IC 134 to the data lines Xam and Xbm.

When the scanning line Yn is outputting a selecting pulse, the data line Xam outputs a signal to an R sub-pixel in the main pixel row 541k. When the scanning line Yn is outputting a selecting pulse, the data line Xbm outputs a signal to a G sub-pixel in the main pixel row 541k.

When the scanning line Yn+1 is outputting a selecting pulse, the data line Xam outputs a signal to an R sub-pixel in the main pixel row 541k+1. When the scanning line Yn+1 is outputting a selecting pulse, the data line Xbm outputs a signal to a B sub-pixel in the main pixel row 541k.

When the scanning line Yn+2 is outputting a selecting pulse, the data line Xam outputs a signal to a B sub-pixel in the main pixel row 541k+1. When the scanning line Yn+2 is outputting a selecting pulse, the data line Xbm outputs a signal to a G sub-pixel in the main pixel row 541k+1.

The scanning lines Yn, Yn+1, and Yn+2 successively outputs selecting pulses in two horizontal periods (2H). The selecting pulse widths are the same; each of the scanning lines Yn, Yn+1, and Yn+2 outputs a selecting pulse to 2M sub-pixels in substantially ⅔ of a horizontal period. One main pixel row includes 3M sub-pixels. The data lines Xam and Xbm output signals to sub-pixels in different main pixel rows or sub-pixels for different colors in the same main pixel row during each selecting pulse.

The above-described method of selecting and driving sub-pixels enables M main pixel columns to be driven by 2M data lines. Within each main pixel consisting of three sub-pixels, two sub-pixels are disposed to be adjacent to each other in the row direction and the other one sub-pixel is disposed to be adjacent to the two sub-pixels in the column direction. Accordingly, two data lines per one main pixel column (2M data lines in total) can be laid out easily. A smaller number of data lines enables larger spacing between a data line and a pixel circuit (the gate of the driving transistor T2 or the storage capacitor C1) to reduce the effects of cross-talk. Furthermore, the power lines can have a wider width to reduce the resistance, which improves the image uniformity.

Figure 7A:
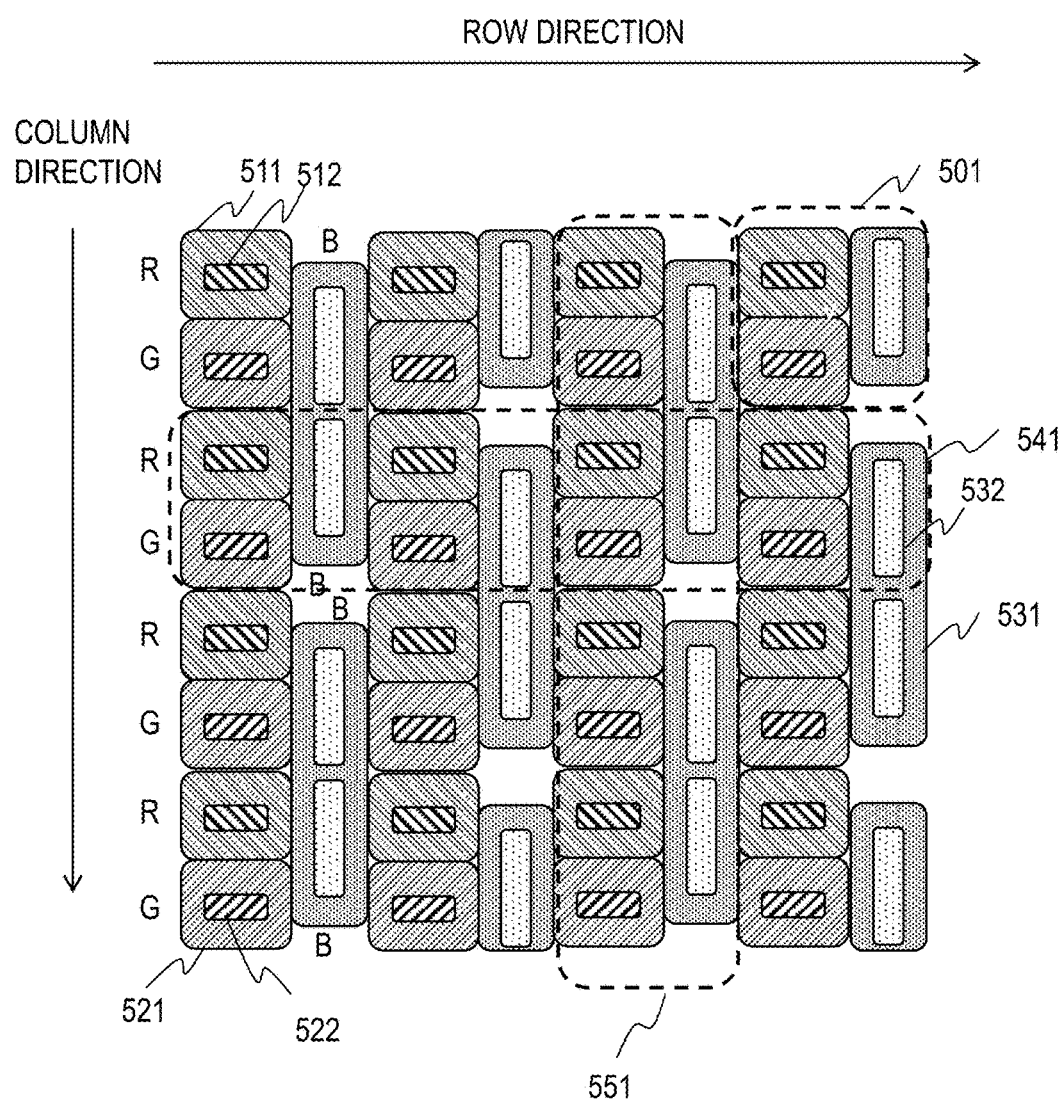
FIG. 7A illustrates another layout of organic light-emitting material areas and light emitting areas of sub-pixels.
Figure 7B:
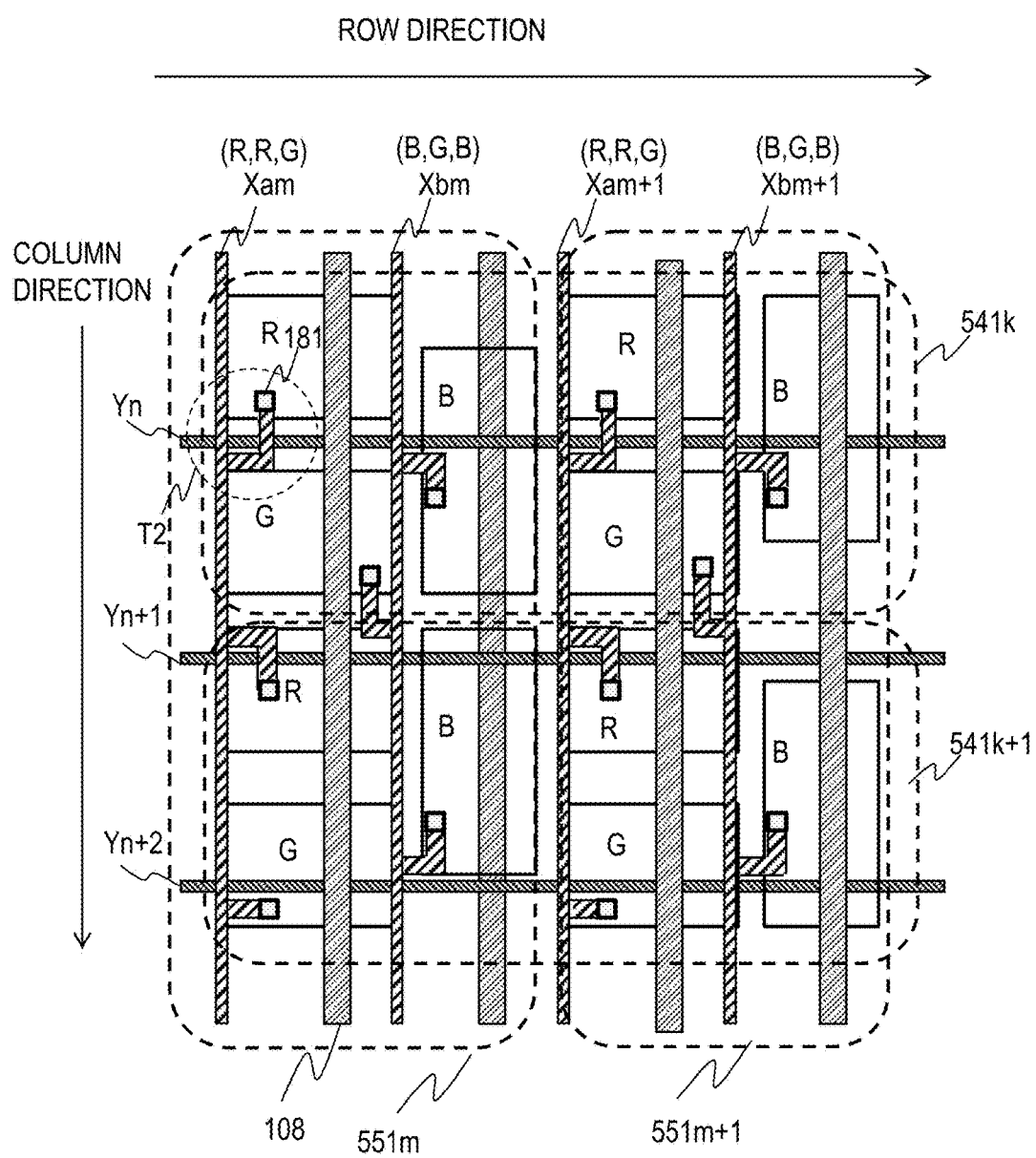
FIG. 7B illustrates another layout of light emitting areas of sub-pixels and lines and another example of connection of the lines with the light emitting areas.

FIGS. 7A and 7B illustrate another example of the pixel layout. Hereinafter, differences from the configuration illustrated in FIGS. 5A and 5B are mainly described. As illustrated in FIG. 7A, in a main pixel, the R sub-pixel and the G sub-pixel are disposed to be adjacent to each other in the column direction. The B sub-pixel is disposed to be adjacent to the R sub-pixel and the G sub-pixel in the row direction. The size in the row direction of the R-light emitting area 512 and the G-light emitting area 522 are longer than the size in the column direction. The size in the column direction of the B-light emitting area 532 is longer than the size in the row direction.

In each main pixel column, the organic light-emitting material areas 531 of a B sub-pixel pair of two adjacent main pixels are continuous. In each main pixel column, the organic light-emitting material areas 531 of adjacent B sub-pixel pairs are separate and distant.

The B sub-pixel pairs are staggered. Between adjacent main pixel columns, the centers of B sub-pixel pairs are located differently in the column direction. In one of two main pixel columns adjacent to each other, B sub-pixel pairs are formed between a main pixel in the odd-numbered row and the main pixel in the next even-numbered row. In the other of the two main pixel columns adjacent to each other, B sub-pixel pairs are formed between a main pixel in an even-numbered row and the main pixel in the next odd-numbered row. The arrangements of B sub-pixel pairs are identical among the even-numbered main pixel columns and identical among the odd-numbered main pixel columns.

As illustrated in FIG. 7B, the scanning line Yn is connected with all R sub-pixels and all B sub-pixels in the main pixel row 541k. The scanning line Yn+1 is connected with all G sub-pixels in the main pixel row 541k and all R sub-pixels in the main pixel row 541k+1. The scanning line Yn+2 is connected with all G sub-pixels and all B sub-pixels in the main pixel row 541k+1.

The data line Xam is connected with all R sub-pixels and a half of the G sub-pixels in the main pixel column 551m. The data line Xbm is connected with all B sub-pixels and the remaining half of the G sub-pixels in the main pixel column 551m. The G sub-pixels in the main pixel column 551m are connected with the data lines Xam and Xbm alternately. In the example of FIG. 7B, the data line Xam is connected with the G sub-pixels in the even-numbered main pixel rows and the data line Xbm is connected with the G sub-pixels in the odd-numbered main pixel rows.

The data line Xam+1 is connected with all R sub-pixels and a half of the G sub-pixels in the main pixel column 551m+1. The data line Xbm+1 is connected with all B sub-pixels and the remaining half of the G sub-pixels in the main pixel column 551m+1. The G sub-pixels in the main pixel column 551m+1 are connected with the data lines Xam+1 and Xbm+1 alternately. In the example of FIG. 7B, the data line Xam+1 is connected with the G sub-pixels in the even-numbered main pixel rows and the data line Xbm+1 is connected with the G sub-pixels in the odd-numbered main pixel rows.

The pixel layout illustrated in FIGS. 7A and 7B enables the sub-pixels in M main pixel columns to be driven by (2/3)M data lines. Within each main pixel consisting of three sub-pixels, the R sub-pixel and the G sub-pixel are disposed to be adjacent to the B sub-pixel in the row direction and the R sub-pixel is disposed to be adjacent to the G sub-pixel in the column direction. Accordingly, the (2/3)M data lines can be laid out easily.

In the configuration in FIGS. 7A and 7B, the R sub-pixels and the G sub-pixels are located close to two data lines. Compared to the configuration in FIG. 7B, the configurations illustrated in FIGS. 5B and 5C allow a large space between a data line and a pixel circuit and therefore, are advantageous in the point of cross-talk with the pixel circuit.

Figure 8A:
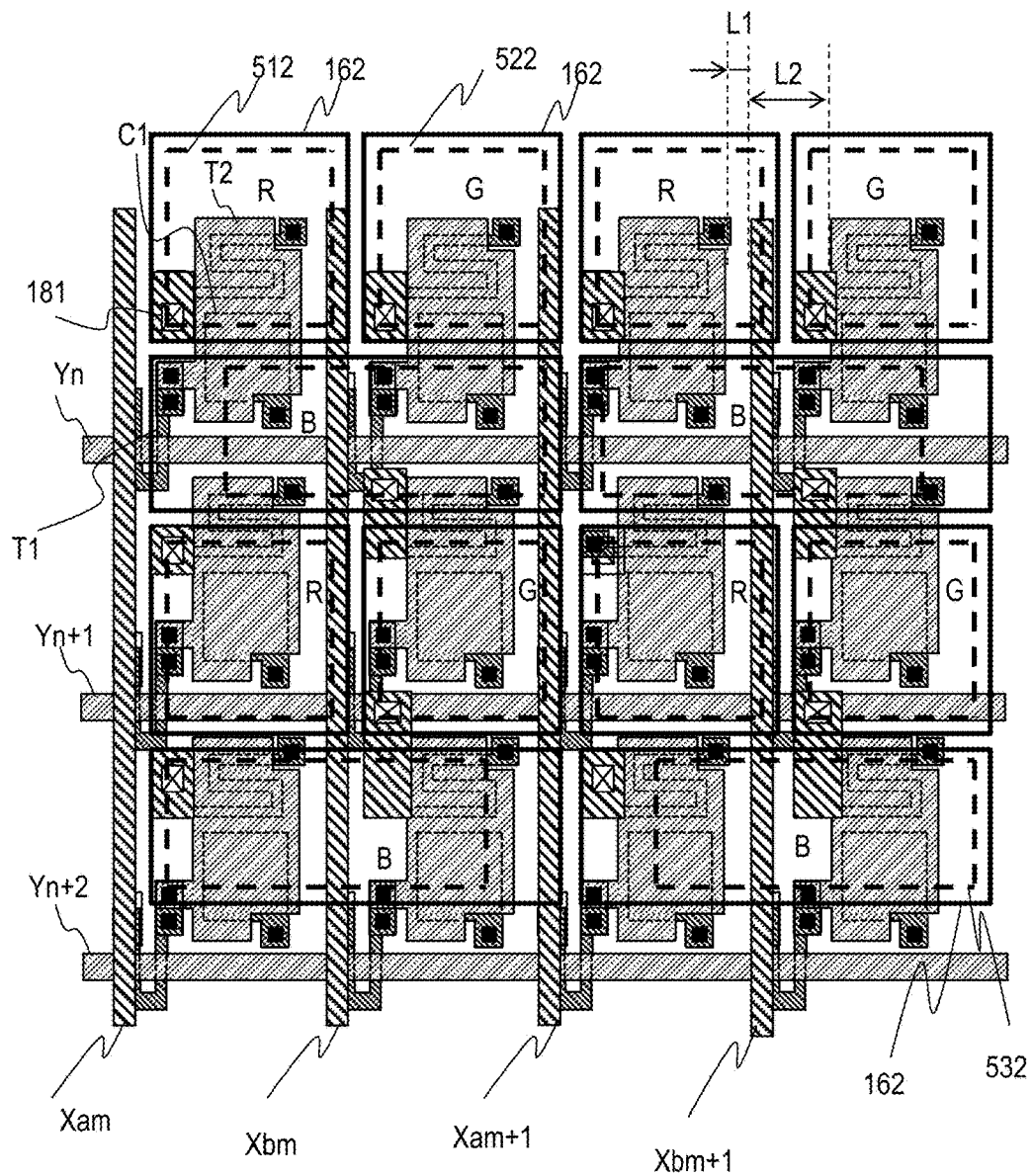
FIG. 8A is a plan view for schematically illustrating a pixel circuit configuration in the layout of FIG. 5B.

FIG. 8A is a plan view for schematically illustrating a pixel circuit configuration in the layout of FIG. 5B. In FIG. 8A, the power lines 108 are omitted. The driving transistors T2 and the storage capacitors C1 of sub-pixels do not overlap with data lines and they are disposed between a data line and a scanning line. Since the circuit design for sub-pixels allows the distance L1 from a data line to a driving transistor T2 (the gate thereof) adjacent to the data line and the distance L2 from the data line to the storage capacitor C1 of the next sub-pixel to be longer, the cross-talk caused by the fringe capacity can be reduced.

The anode electrode 162 and the B-light emitting area 532 of a B sub-pixel are formed to be wide along a scanning line in the lower half of a pixel. The anode electrodes 162 of an R sub-pixel and a G sub-pixel are disposed to be adjacent to each other in the row direction in the upper half of a pixel. The R-light emitting area 512 and the G-light emitting area 522 are disposed to be adjacent to each other in the row direction in the upper half of a pixel. The anode electrode 162 of a B sub-pixel is disposed to be adjacent to the anode electrodes 162 of the R sub-pixel and the G sub-pixel in the column direction and the B-light emitting area 532 is disposed to be adjacent to the R-light emitting area 512 and the G-light emitting area 522 in the column direction.

Figure 8B:
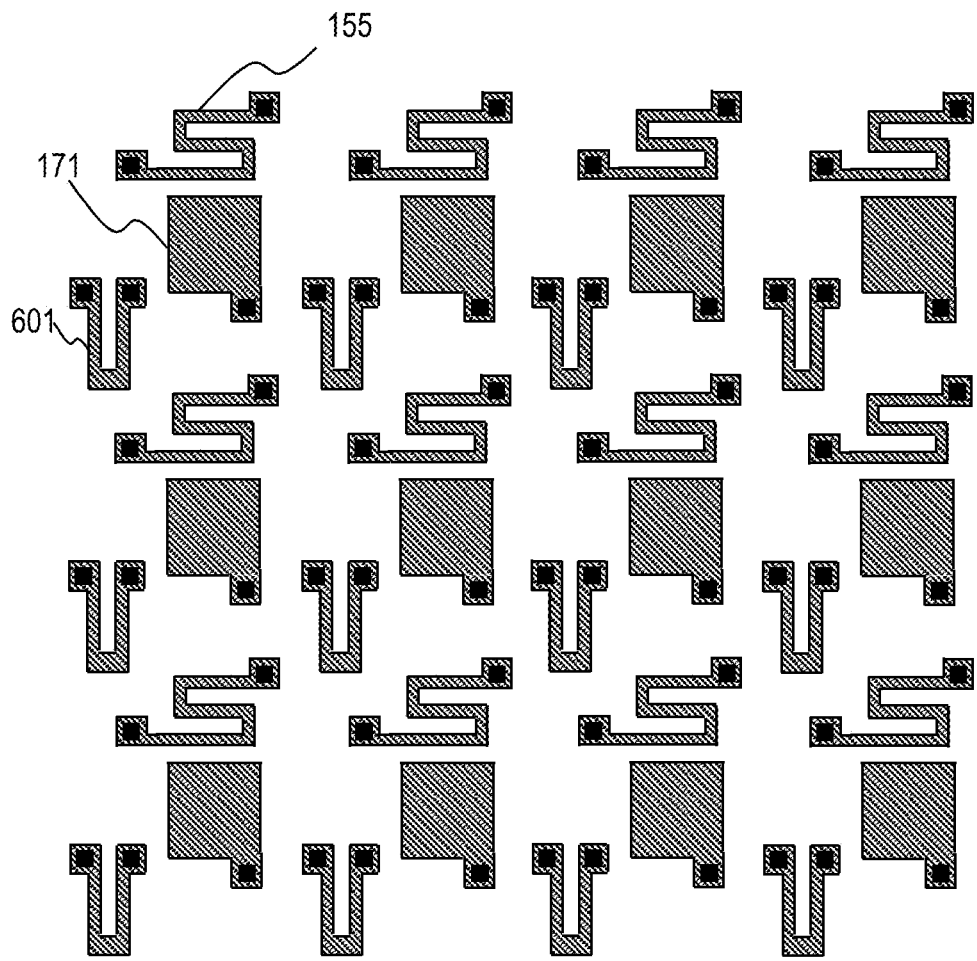
FIG. 8B is a diagram for illustrating patterning a layer in manufacturing pixel circuits.
Figure 8C:
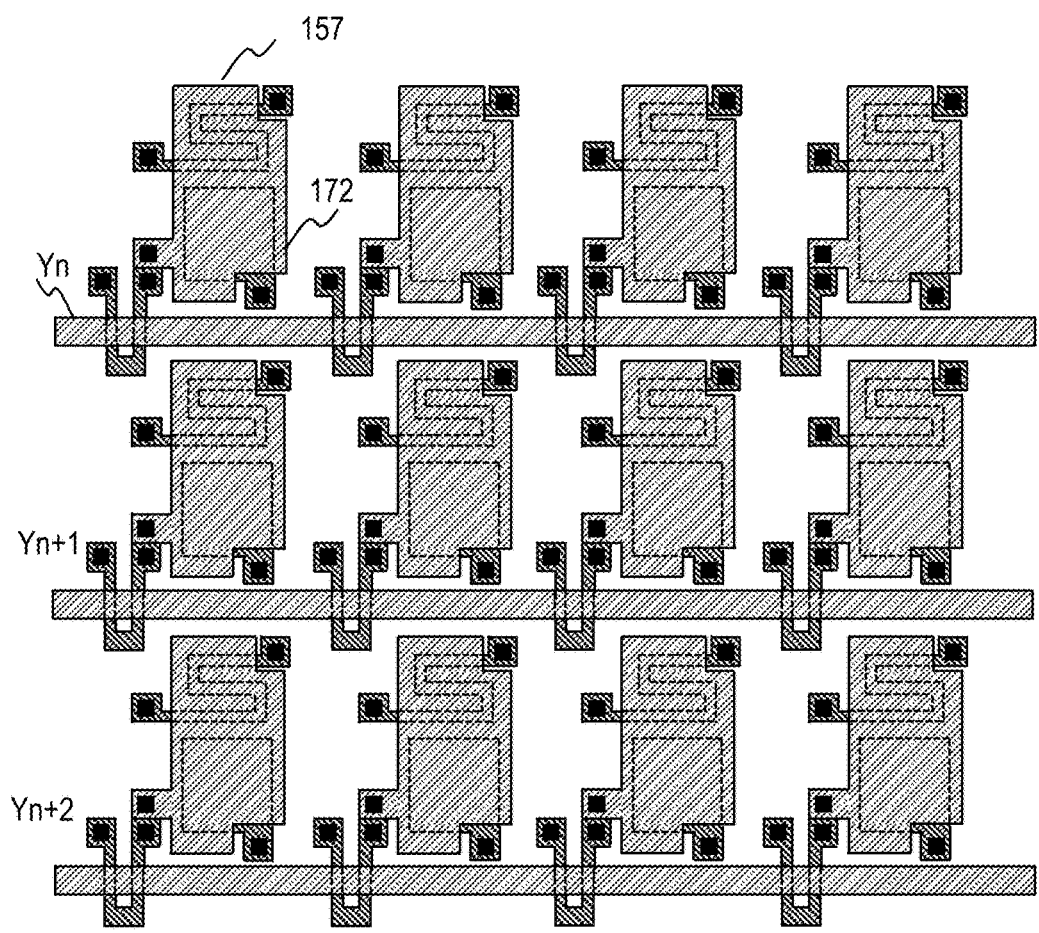
FIG. 8C is a diagram for illustrating patterning a layer in manufacturing pixel circuits.
Figure 8D:
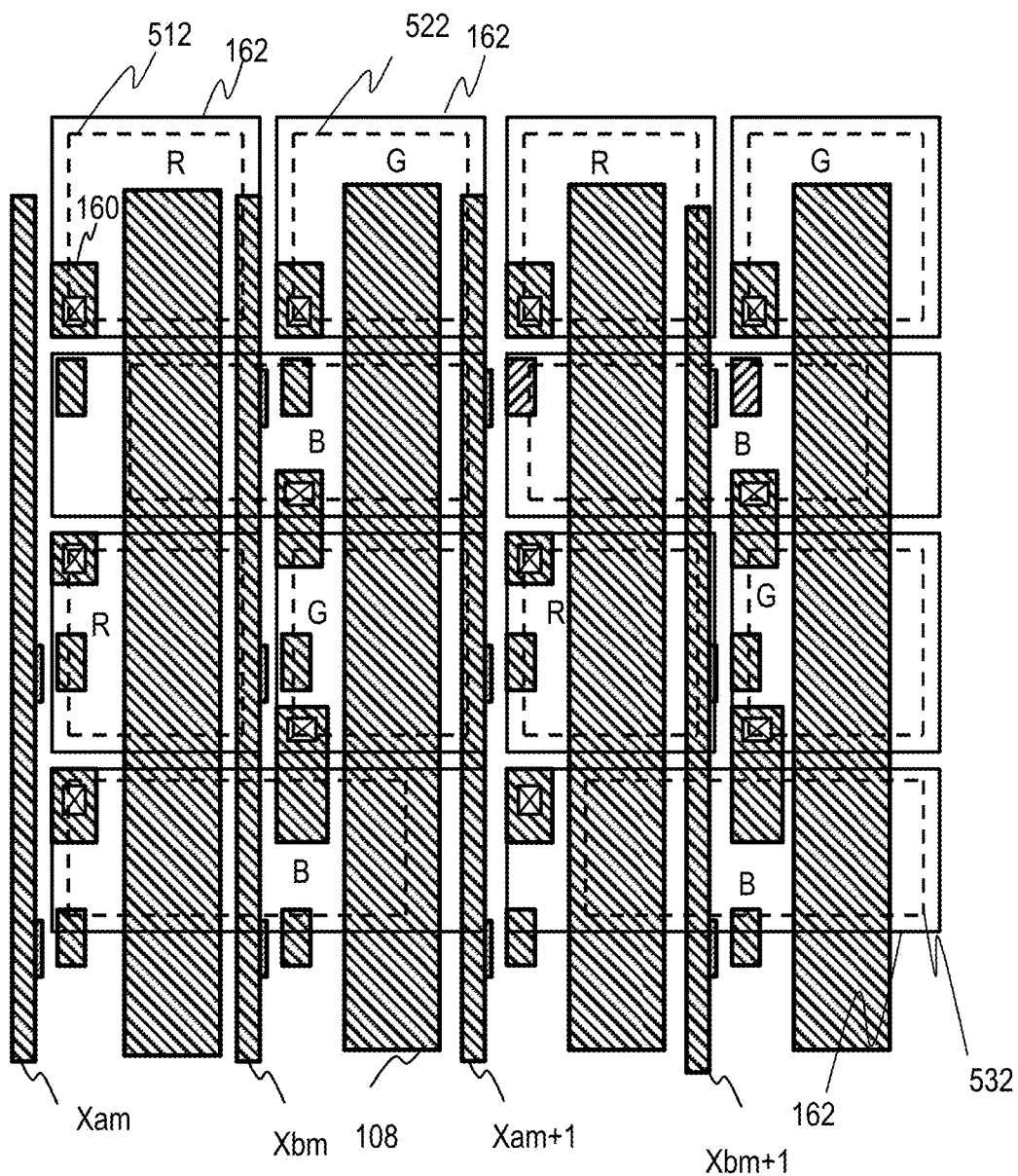
FIG. 8D is a diagram for illustrating patterning a layer in manufacturing pixel circuits.

With reference to FIGS. 8B to 8D, patterning of layers in manufacturing pixel circuits is described. Each of FIGS. 8B to 8D illustrates patterning of a different layer. The pixel circuit manufacturing method first forms the insulating film (such as a silicon nitride film) 152 on a substrate by chemical vapor deposition (CVD).

Next, the method forms patterns of low-temperature poly-silicon using a known low-temperature poly-silicon TFT fabrication technique as illustrated in FIG. 8B. For example, the method deposits amorphous silicon by CVD and crystalizes the amorphous silicon by excimer laser annealing (ELA) to form the poly-silicon layer. The poly-silicon layer corresponds to the channels 601 of the switching transistors T1, the channels 155 of the driving transistors T2, and the electrodes 171 of the storage capacitors C1. The channels of the driving transistors T2 are formed long enough to prevent non-uniformity in output current.

After forming the gate insulating film 156 on the low-temperature poly-silicon layer, the method forms first metal patterns as illustrated in FIG. 8C. The first metal patterns correspond to the scanning lines Yn, Yn+1, Yn+2 (the gate electrodes of the switching transistors T1), the gate electrodes 157 of the driving transistors T2, and the electrodes 172 of the storage capacitors C1. In each sub-pixel, the gate electrode 157 and the electrode 172 are continuous to increase the capacitance.

The first metal patterns can be formed by sputtering, for example. The first metal patterns can be a single layer or multiple layers made of a material(s) selected from a group including Mo, W, Nb, MoW, MoNb, Al, Nd, Ti, Cu, a Cu alloy, an Al alloy, Ag, and an Ag alloy.

After forming the interlayer insulating film 158 over the first metal patterns by CVD, for example, and opening contact holes, the method forms second metal patterns as illustrated in FIG. 8D. The second meal patterns include the source and drain electrodes of the switching transistors T1, the source and drain electrodes 159 and 160 of the driving transistors T2, the data lines Xam, Xbm, Xam+1, and Xbm+1, and power lines 108. For example, the second metal patterns are formed of an aluminum alloy of Ti/Al/Ti by sputtering.

Next, the method deposits a photosensitive organic material to form the planarization film 161 and opens contact holes for connecting to the drain electrodes 160 of the driving transistors T2. Furthermore, the method forms the anode electrodes 162 on the planarization film 161. The anode electrodes 162 are formed by depositing Ag, Mg, Al, Pt, Pd, Au, Ni, Nd, Ir, Cr, or a metallic compound thereof as a reflective film, depositing ITO, IZO, ZnO, $In_2O_3$, or the like on the reflective film as a transparent film, and patterning the films. The anode electrodes 162 are connected to the drain electrodes 160 through the contacts 181 formed in the contact holes in the planarization film 161.

Next, the method forms the pixel defining layer 163. The pixel defining layer 163 can be formed by depositing a photosensitive organic resin by spin coating and patterning the photosensitive organic resin. The pixel defining layer 163 forms separate light emitting areas of sub-pixels.

The method applies organic light-emitting materials for the colors of R, G, and B color by color onto the anode electrodes 162 exposed from the openings of the pixel defining layer 163 to form organic light-emitting layers 165. The organic light-emitting material for B is deposited over two sub-pixels adjacent to each other side by side. Since the anode electrodes 162 for different sub-pixels are separated and connected to different driving transistors T2, there is no problem to form the organic light-emitting films 165 over a plurality of pixels.

Each organic light-emitting film 165 consists of, for example, a hole injection layer, a hole transport layer, a light emitting layer, an electron transport layer, and an electron injection layer. The laminated structure of the organic light-emitting film 165 is optional and can be a single layer. The materials of the light emitting films 165 are different depending on the color of the sub-pixel; the film thicknesses of the layers of the organic light-emitting films 165 are controlled depending on the sub-pixel.

The method deposits a metal having a small work function onto the organic light-emitting films 165 to form the cathode electrode 166. The cathode electrode 166 is made of, for example, Li, Ca, LiF/Ca, LiF/Al, Al, Mg, or a compound thereof. To increase the light extraction efficiency, the method further forms the cap layer 167. Through the foregoing processes, R, G, and B sub-pixels, scanning lines, data lines, and power lines are formed.

The above-described connection of main pixels including a plurality of sub-pixels, scanning lines, and data lines in the display device in this embodiment is summarized as follows.

A plurality of scanning lines (for example, Yn, Yn+1, and Yn+2) include first scanning lines (for example, the scanning line Yn) and second scanning lines (for example, the scanning line Yn+1). Each of the first scanning lines is connected with the sub-pixels for a first color and the sub-pixels for a second color included in a first main pixel group (for example, the plurality of main pixels in the main pixel row 541k) in which main pixels are disposed in a row. Each of the second scanning lines is connected with the sub-pixels for the second color included in a second main pixel group (for example, the plurality of main pixels in the main pixel row 541k+1) in which main pixels are disposed in a row adjacent to the row of the first main pixel group and the sub-pixels for the third color included in the first main pixel group.

The plurality of scanning lines further include third scanning lines (for example, the scanning line Yn+2) each connected with the sub-pixels for the first color and the sub-pixels for the third color included in the second main pixel group.

A plurality of data lines (for example, Xam, Xbm, Xam+1, and Xbm+1) include first data lines (for example, Xam) and second data lines (for example, Xbm). Each of the first data lines is connected with the sub-pixels for the first color and sub-pixels for the third color included in a plurality of main pixels disposed in a column. Each of the second data lines is connected with the sub-pixels for the second color and the sub-pixels for the third color that are not connected with the first data line included in the plurality of main pixels disposed in the column.

In FIG. 5B, the first color, the second color, and the third color are red, green, and blue, respectively; in FIG. 5C, the first color, the second color, and the third color are green, red, and blue, respectively; and in FIG. 7B, the first color, the second color, and the third color are red, blue, and green, respectively.

As understood from the above, this embodiment achieves smaller numbers of data lines, power lines, and output terminals of the driver IC with display at real resolution. The less dense data lines and power lines allow flexible disposition of transistors and storage capacitors.

As set forth above, an embodiment of this invention has been described; however, this invention is not limited to the foregoing embodiment. Those skilled in the art can easily modify, add, or convert each element in the foregoing embodiment within the scope of this invention. A part of the configuration of one embodiment may be replaced with a configuration of another embodiment or a configuration of an embodiment may be incorporated into a configuration of another embodiment.

What is claimed is:

1. A display device comprising:
   main pixels arrayed in a matrix;
   scanning lines disposed to extend in a row direction and be distant from one another in a column direction perpendicular to the row direction; and
   data lines disposed to extend in the column direction and be distant from one another in the row direction,
   wherein each main pixel includes a sub-pixel for a first color, a sub-pixel for a second color, and a sub-pixel for a third color,
   wherein, in each main pixel, the sub-pixel for the second color is disposed to be adjacent to the sub-pixel for the first color in the row direction,
   wherein, in each main pixel, the sub-pixel for the third color is disposed to be adjacent to the sub-pixel for the first color in the column direction,
   wherein each of the sub-pixels for the first color, the sub-pixels for the second color, and the sub-pixels for the third color includes a transistor, a first electrode connected with the transistor, an element isolation film provided over the first electrode, a light emitting material area formed to cover an opening provided in the element isolation film, and a second electrode provided above the light emitting material area,
   wherein openings in the element isolation film define light emitting areas of the sub-pixels for the first color, the sub-pixels for the second color, and the sub-pixels for the third color,
   wherein each of the sub-pixels for the first color, the sub-pixels for the second color, and the sub-pixels for the third color is connected with one of the scanning lines and one of the data lines,
   wherein number of main pixels per row is M (M is a natural number) and number of main pixels per column is N (N is a positive even number),
   wherein number of the scanning lines is (3/2)N,
   wherein number of sub-pixels connected with each of the scanning lines is 2M,
   wherein number of the data lines is 2M,
   wherein number of main pixels connected with each of the data lines is N, and
   wherein number of sub-pixels connected with each of the data lines is (3/2)N.

2. The display device according to claim 1,
   wherein a light emitting life of a light emitting material for the third color is shorter than light emitting lives of a light emitting material for the first color and a light emitting material for the second color,
   wherein, in each main pixel, the sub-pixel for the third color is disposed to be adjacent to both of the sub-pixel for the first color and the sub-pixel for the second color in the column direction, and
   wherein, in each main pixel, the light emitting area of the sub-pixel for the third color is larger than both of the light emitting area of the sub-pixel for the first color and the light emitting area of the sub-pixel for the second color.

3. The display device according to claim 2, wherein the first color, the second color, and the third color are red, green, and blue, respectively.

4. The display device according to claim 2,
   wherein, in each main pixel, light emitting material areas for the sub-pixel for the first color, the sub-pixel for the second color, and the sub-pixel for the third color are separate,
   wherein, in each pair consisting of two main pixels adjacent to each other in the row direction, light emitting material areas of sub-pixels for the third color are continuous and light emitting areas of sub-pixels for the third color are distant, and
   wherein, between pairs of main pixels adjacent to each other in the row direction, light emitting material areas of sub-pixels for the third color are distant.

5. The display device according to claim 4,
   wherein, in a first main pixel row, each pair of main pixels adjacent to each other consists of a main pixel in an odd-numbered column and a main pixel in the next even-numbered column, and
   wherein, in a second main pixel row adjacent to the first main pixel row, each pair of main pixels adjacent to each other consists of a main pixel in an even-numbered column and a main pixel in the next odd-numbered column.

6. The display device according to claim 2,
   wherein, in each main pixel, a data line is disposed to extend in the column direction between the light emitting area of the sub-pixel for the first color and the light emitting area of the sub-pixel for the second color, and
   wherein power lines are disposed to extend in the column direction and alternate with the data lines in the row direction.

7. The display device according to claim 1, wherein the scanning lines include first type of scanning lines connected with ⅔ of the sub-pixels included in one main pixel row and second type of scanning lines connected with ⅓ of the sub-pixels included in each of two main pixel rows adjacent to each other.

8. The display device according to claim 1,
wherein the first color, the second color, and the third color are red, blue, and green, respectively, and
wherein, in each main pixel, the sub-pixel for the second color is disposed to be adjacent to the sub-pixel for the first color and the sub-pixel for the third color in the row direction.

* * * * *